US011328994B2

(12) United States Patent
Zhou

(10) Patent No.: US 11,328,994 B2
(45) Date of Patent: May 10, 2022

(54) METHOD FOR FABRICATING CU INTERCONNECTION USING GRAPHENE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Ming Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/602,699

(22) Filed: May 23, 2017

(65) Prior Publication Data
US 2018/0033734 A1  Feb. 1, 2018

(30) Foreign Application Priority Data

Aug. 1, 2016  (CN) .......................... 201610620762.0

(51) Int. Cl.
H01L 23/48  (2006.01)
H01L 23/532 (2006.01)
(Continued)

(52) U.S. Cl.
CPC .. *H01L 23/53238* (2013.01); *H01L 21/32055* (2013.01); *H01L 21/76805* (2013.01);
(Continued)

(58) Field of Classification Search
CPC ......... H01L 23/53238; H01L 21/32055; H01L 21/76805; H01L 21/76837; H01L 21/76843; H01L 23/528; H01L 23/53276
See application file for complete search history.

(56) References Cited

U.S. PATENT DOCUMENTS 8,610,278 B1   12/2013  Ott et al.
2003/0183940 A1  10/2003  Noguchi et al.
(Continued)

FOREIGN PATENT DOCUMENTS

CN    103208425    7/2013
CN    103579097    2/2014
(Continued)

OTHER PUBLICATIONS

European Application No. 17183708.1, Extended European Search Report dated Dec. 7, 2017, 9 pages.
(Continued)

*Primary Examiner* — Samuel A Gebremariam
(74) *Attorney, Agent, or Firm* — Anova Law Group, PLLC

(57) ABSTRACT

A method for manufacturing an interconnect structure includes providing a substrate structure comprising a substrate, a first dielectric layer on the substrate, and a metal interconnect line formed in the first dielectric layer and extending through to a surface of the substrate; removing a portion of the first dielectric layer on opposite sides of the metal interconnect line to expose a surface of the metal interconnect line and to form a recess; forming a graphene layer on the exposed surface of the metal interconnect line; and forming a second dielectric layer filling the recess and covering the graphene layer. The interconnect structure can prevent metal atoms of the metal interconnect line from diffusion into the first and second dielectric layers.

17 Claims, 11 Drawing Sheets

(51) Int. Cl.
*H01L 21/768* (2006.01)
*H01L 21/3205* (2006.01)
*H01L 23/528* (2006.01)

(52) U.S. Cl.
CPC .. *H01L 21/76837* (2013.01); *H01L 21/76843* (2013.01); *H01L 21/76852* (2013.01); *H01L 21/76885* (2013.01); *H01L 23/528* (2013.01); *H01L 23/5329* (2013.01); *H01L 23/53276* (2013.01); *H01L 21/76813* (2013.01)

(56) References Cited

U.S. PATENT DOCUMENTS

| | | | | |
|---|---|---|---|---|
| 2011/0074044 | A1* | 3/2011 | Lin | G03F 7/0757 257/776 |
| 2012/0309143 | A1* | 12/2012 | Takao | H01L 27/11 438/199 |
| 2013/0299988 | A1 | 11/2013 | Bonilla et al. | |
| 2013/0302978 | A1* | 11/2013 | Bonilla | H01L 21/76852 438/627 |
| 2014/0024211 | A1* | 1/2014 | Ott | H01L 23/5222 438/637 |
| 2014/0291819 | A1* | 10/2014 | Barth | H01L 23/53276 257/659 |

FOREIGN PATENT DOCUMENTS

| | | |
|---|---|---|
| CN | 103943599 A | 7/2014 |
| CN | 104103626 | 10/2014 |
| CN | 104428893 | 3/2015 |

OTHER PUBLICATIONS

Chinese Application No. 201610620762.0, Office Action dated Sep. 3, 2020, 10 pages.

* cited by examiner

METHOD FOR FABRICATING CU INTERCONNECTION USING GRAPHENE

CROSS-REFERENCES TO RELATED APPLICATIONS

The present application claims priority to Chinese patent application No. 201610620762.0, filed with the State Intellectual Property Office of People's Republic of China on Aug. 1, 2016, the content of which is incorporated herein by reference in its entirety.

FIELD OF THE INVENTION

The present invention relates to semiconductor technology, and more particularly to a semiconductor interconnect structure and the method of forming the same.

BACKGROUND OF THE INVENTION

A gradual reduction in the dimension of interconnect structures may limit the speed of signal propagation in semiconductor devices. The use of copper and low-k dielectric materials may reduce the delay in signal propagation. However, the diffusion of copper into a dielectric material will affect the effective dielectric k constant value of the dielectric material, and that the diffusion effect becomes more significant with increasing diffusion severity that may cause the dielectric material to become conductive, thereby affecting the device reliability.

Further, after planarization, exposed copper is easily oxidized by air, resulting in a relatively short queue time (Q-time) of a chemical mechanical planarization (CMP) process, which is disadvantageous to the development of semiconductor manufacturing processes.

BRIEF SUMMARY OF THE INVENTION

Embodiments of the present disclosure provide a novel method of manufacturing a metal interconnect structure that can prevent the metal in the metal interconnection from diffusing into the dielectric layer.

Embodiments of the present disclosure also provide a novel interconnect structure.

According to some embodiments of the present invention, a method for manufacturing an interconnect structure may include providing a substrate structure comprising a substrate, a first dielectric layer on the substrate, and a metal interconnect line extending through the first dielectric layer; removing a portion of the first dielectric layer on the metal interconnect line to form a recess exposing a surface of the metal interconnect line; forming a graphene layer on the exposed surface of the metal interconnect line; and forming a second dielectric layer filling the recess and covering the graphene layer.

In one embodiment, the substrate structure may further include a first barrier layer between the substrate and the first dielectric layer, the metal interconnect line extending through the first dielectric layer and the first barrier layer.

In one embodiment, the first barrier layer is formed on the substrate prior to forming the first dielectric layer, and removing the portion of the first dielectric layer on the metal interconnect line also exposes a surface of the first barrier layer. The method further includes forming an amorphous carbon layer on the exposed surface of the first barrier layer.

In one embodiment, the substrate structure further includes a second barrier layer formed at a bottom and on a side surface of the metal interconnect line.

In one embodiment, removing the portion of the first dielectric layer on the metal interconnect line to form the recess includes exposing a portion of the second barrier layer on the side surface of the metal interconnect line; and removing the exposed portion of the second barrier layer on the side surface of the metal interconnect line to form the recess.

In one embodiment, providing the substrate structure may include providing the substrate; forming the first barrier layer on the substrate; forming the first dielectric layer on the first barrier layer; forming a patterned first hardmask on the first dielectric layer; sequentially etching the first dielectric layer and the first barrier layer using the patterned first hardmask as a mask to form a through-hole; forming the second barrier layer on a sidewall of the through-hole; forming a metal layer filling the through-hole; and performing a planarization process to remove the patterned first hardmask to expose a surface of the first dielectric layer.

In one embodiment, the through-hole is a through-hole having a damascene structure, and sequentially etching the first dielectric layer and the first barrier layer includes performing a first etching process on the first dielectric layer using the patterned first hardmask as a mask to form a first opening and a second opening; forming a patterned second hardmask on the first opening; performing a second etching process on the first dielectric layer using the patterned first hardmask and the patterned second hardmask as a mask to form a third opening; removing the patterned second hardmask; performing a third etching process on the first dielectric layer and the first barrier layer using the patterned first hardmask as a mask to form a first through-hole and a second through-hole extending to the substrate, the first through-hole including the first opening and the third opening, and the second through-hole including the second opening.

In one embodiment, the graphene layer includes a layer of fluorinated graphene.

In one embodiment, forming the graphene layer includes a chemical vapor deposition process including supplying a reaction gas comprising methane, hydrogen, and a carrier gas, the chemical vapor deposition process being carried out at a temperature in a range between 600° C. and 1500° C., a reaction time in a range between 5 minutes and 300 minutes, a flow rate of the carrier gas in a range between 50 sccm and 10,000 sccm, a ratio of a flow rate of the method to a flow rate of the carrier gas in a range between 0.05% and 50%, and a ratio of a flow rate of the hydrogen to the flow rate of the carrier gas in a range between 0.05% and 50%.

In one embodiment, the method further includes performing a planarization process on the second dielectric layer.

In one embodiment, the method further includes forming a third dielectric layer on the second dielectric layer for a second interconnect structure.

In one embodiment, the method further includes forming a third barrier layer on the second dielectric layer, wherein the third dielectric layer is formed on the third barrier layer.

In one embodiment, the metal interconnect line includes copper, and the first and second dielectric layers each comprise silicon oxide or a low-k dielectric material.

In one embodiment, the first barrier layer includes SiCN, and the second barrier layer includes Ta, TaN, or stacked layers of Ta and TaN.

In one embodiment, the graphene layer includes 1 to 30 layers of monoatomic graphene layers.

Embodiments of the present disclosure also provide an interconnect structure, which includes a substrate; a metal interconnect line including an upper surface and a side surface on the substrate and; a graphene layer on the upper surface and the side surface of the metal interconnect line; and a dielectric layer on the substrate covering a portion of the graphene layer on the side surface of the metal interconnect line.

In one embodiment, the dielectric layer does not cover a portion of the graphene layer on the upper surface of the metal interconnect line.

In one embodiment, the dielectric layer further covers a portion of the graphene layer on the upper surface of the metal interconnect line.

In one embodiment, the interconnect structure further includes a first barrier layer between the substrate and the dielectric layer, wherein the graphene layer is formed on the upper surface and the side surface of the metal interconnect line and on a side portion of the first barrier layer.

In one embodiment, the interconnect structure further includes an amorphous carbon layer between the first barrier layer and the dielectric layer.

In one embodiment, the interconnect structure further includes a second barrier layer having a portion between the metal interconnect layer and the substrate and a portion between the metal interconnect layer and the first barrier layer.

In one embodiment, the interconnect structure further includes a second dielectric layer on the graphene layer for forming a second interconnect structure.

In one embodiment, the interconnect structure further includes a third barrier layer on the on the upper surface of the metal interconnect line and on the dielectric layer; and a third dielectric layer on the third barrier layer for forming a new interconnect structure.

In one embodiment, the interconnect structure further includes a next dielectric layer on the dielectric layer for forming a next interconnect structure. In one embodiment, the interconnect structure also includes a next barrier layer on the between the dielectric layer and the next dielectric layer.

In one embodiment, the graphene layer includes a layer of fluorinated graphene.

In one embodiment, the metal interconnect line includes a damascene structure.

In one embodiment, the metal interconnect line includes copper, and the dielectric layer includes silicon oxide or a low-k dielectric material.

In one embodiment, the first barrier layer includes SiCN, and the second barrier layer includes Ta, TaN, or stacked layers of Ta and TaN.

In one embodiment, the graphene layer includes 1 to 30 layers of monoatomic graphene layers.

The following detailed description together with the accompanying drawings will provide a better understanding of the nature and advantages of the present invention.

DETAILED DESCRIPTION OF THE INVENTION

Figure 1:
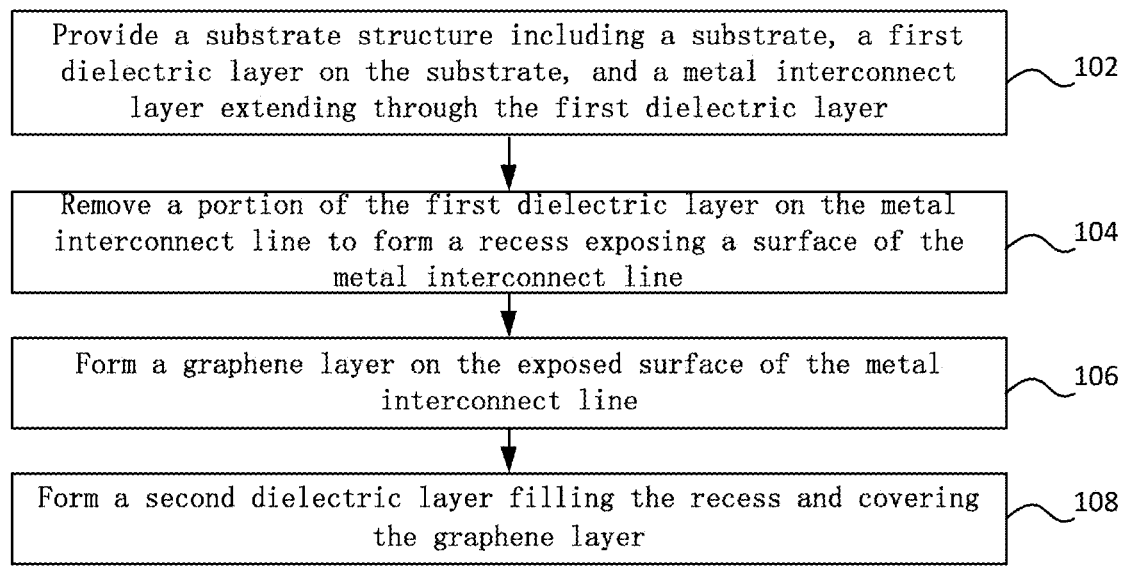
FIG. 1 is a flowchart illustrating a method for manufacturing an interconnect structure according to one embodiment of the present disclosure.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

FIG. 1 is a flowchart illustrating a method for manufacturing an interconnect structure according to one embodiment of the present disclosure. The method may include the following steps:

Step 102: providing a substrate structure including a substrate, a first dielectric layer on the substrate, and a metal interconnect line (wire) extending through the first dielectric layer.

Step 104: removing a portion of the first dielectric layer on the metal interconnect line to form a recess and expose a surface of the metal interconnection line.

Step 106: forming a graphene layer on the exposed surface of the metal interconnect line.

Step 108: forming a second dielectric layer filling the recess and covering the graphene layer.

The present inventor has discovered that the graphene atomic layer can insulate the metal interconnect line from contacting external active medium, and even under heating, there is no significant oxidation in the graphene atomic layer, and the graphene has good anti-oxidation performance.

In the method of manufacturing the interconnect structure according to the present disclosure, the dielectric layer on the metal interconnect line is removed to expose a surface of the metal interconnect line, the graphene layer is formed on the exposed surface of the metal interconnect line, and a new (next) dielectric layer is formed. The graphene layer separates the metal interconnect line from the dielectric layer, so that metal atoms of the metal interconnect line can be prevented from diffusing into the dielectric layer. In addition, the high oxidation resistance of the graphene layer prevents the graphene layer from being oxidized even when the graphene layer is exposed to air, further preventing the metal interconnect line from being oxidized by the air, thereby improving the reliability of the device.

FIGS. 2A to 2F are simplified cross-sectional views of intermediated stages of an interconnect structure according to an embodiment of the present disclosure.

Figure 2A:
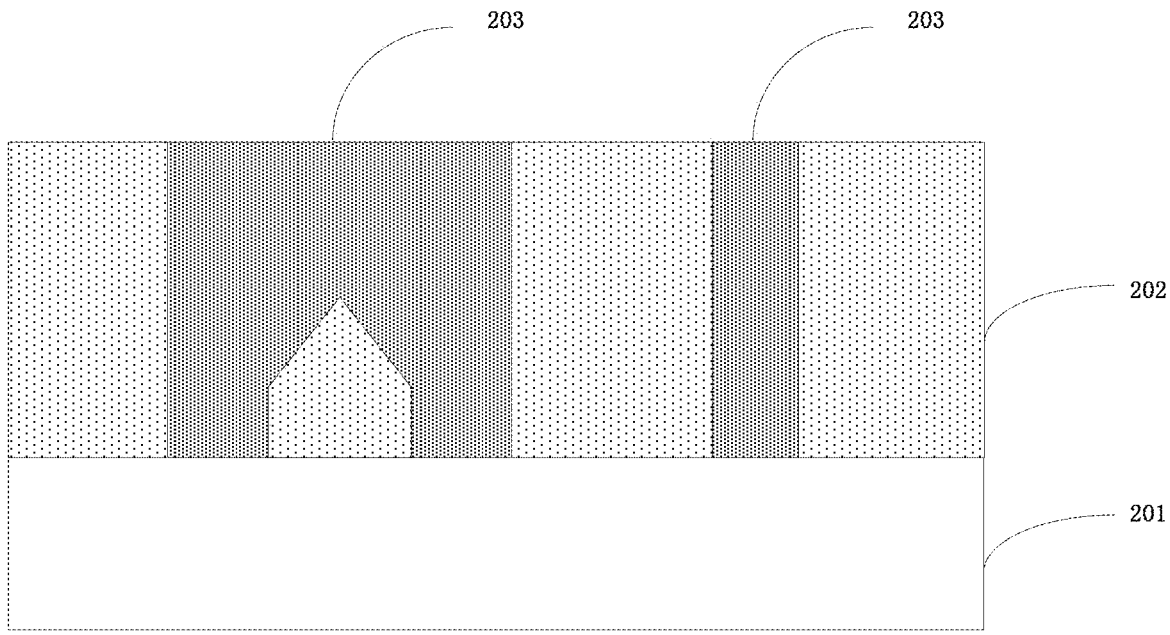
FIG. 2A is a cross-sectional view illustrating an intermediate stage of an interconnect structure according to one embodiment of the present disclosure.

Referring to FIG. 2A, a substrate structure is provided. The substrate structure includes a substrate 201, a first dielectric layer 202 on substrate 201, and a metal interconnect line 203 extending through first dielectric layer 202.

It is to be understood that substrate 201 may include a semiconductor substrate, and a semiconductor device and a shallow trench isolation region (not shown) formed on the semiconductor substrate. In one embodiment, the metal interconnect line may be a damascene interconnect structure, i.e., metal interconnect line 203 may include a wide upper portion and a narrow lower portion, as shown in the left portion of metal interconnect line 203 in FIG. 2A. In one embodiment, the metal interconnect line may include, but not limited to, copper, and the first dielectric layer may include silicon oxide, a low-k dielectric material, or an ultra-low-k dielectric material.

Figure 2B:
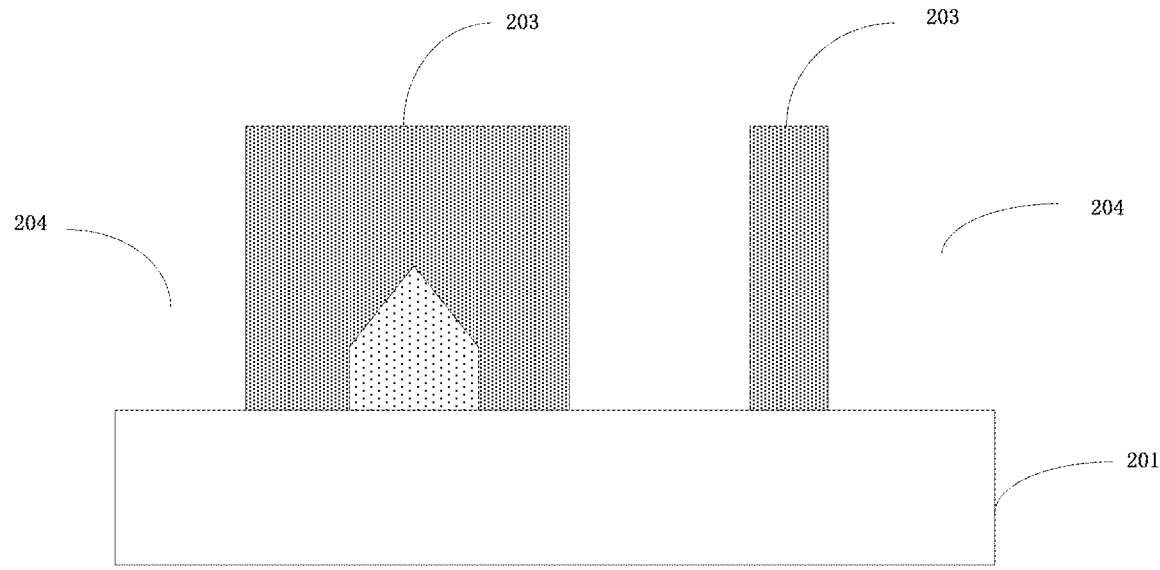
FIG. 2B is a cross-sectional view illustrating an intermediate stage of an interconnect structure according to one embodiment of the present disclosure.

Next, referring to FIG. 2B, a portion of first dielectric layer 202 on metal interconnect line 203 is removed to form a recess 204 such that a surface of metal interconnect line 203 is exposed. As shown in FIG. 2B, the portion of the first dielectric layer on opposite sides of the metal interconnect line is removed, and recess 204 is formed adjacent to the opposite sides of the metal interconnect line to expose a surface of the metal interconnect line.

Wet or dry etching may be used to remove the portion of first dielectric layer 202 on the opposite sides of the metal interconnect line in accordance with the material of first dielectric layer 202. For example, in the case where the material of first dielectric layer 202 is a polyethylene oxide (PEOX), the PEOX may be removed using a dilute hydrofluoric acid. For example, in the case where the material of first dielectric layer 202 is a low-k or ultra-low-k silicon carbide (SiOCH), the SiOCH may be removed using a hydrogen-containing plasma.

Figure 2C:
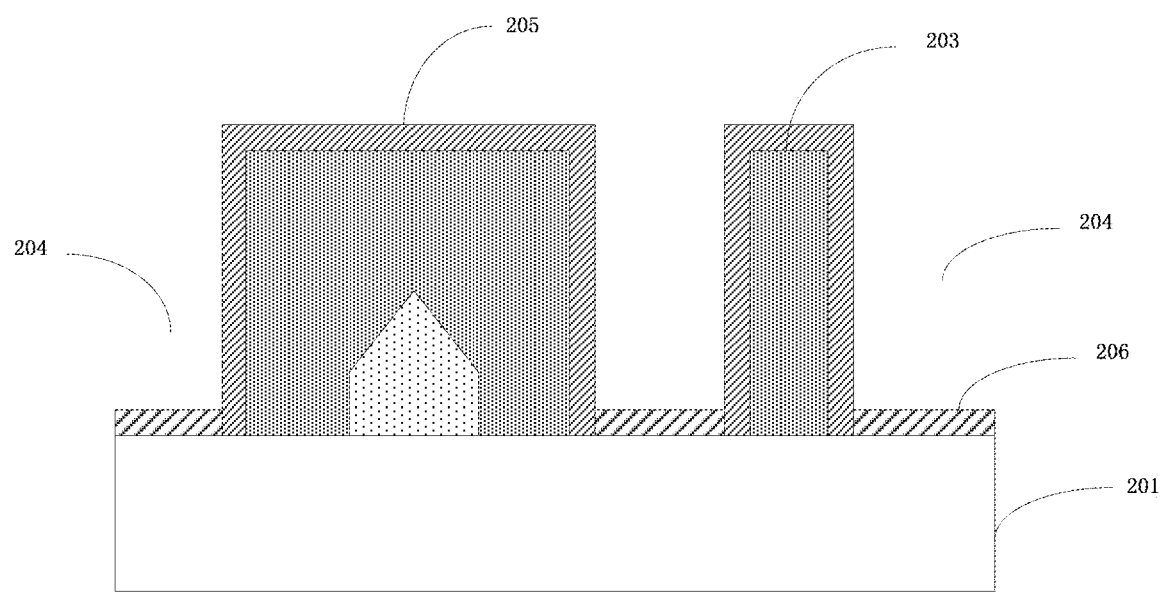
FIG. 2C is a cross-sectional view illustrating an intermediate stage of an interconnect structure according to one embodiment of the present disclosure.

Next, referring to FIG. 2C, a graphene layer 205 is formed on the exposed surface of metal interconnect line 203. In one embodiment, while graphene layer 205 is formed on the exposed surface of metal interconnect line 203, an amorphous carbon layer 206 may also be formed on the exposed surface of substrate 201, which may serve as an insulating layer between the substrate and a subsequently formed dielectric layer.

In one embodiment, graphene layer 205 may be formed using a chemical vapor deposition (CVD) process. The CVD process conditions may include supplying a reaction gas including methane, hydrogen, and a carrier gas, which may be, for example, nitrogen or argon; at a reaction temperature in the range between 600° C. and 1500° C.; and a reaction time in the range between 5 minutes and 300 minutes. The flow rate of the carrier gas is in the range between 50 sccm and 10,000 sccm, the ratio of the flow rate of methane to the flow rate of the carrier gas is in the range between 0.05% and 50%, and the ratio of the flow rate of the hydrogen gas to the flow rate of the carrier gas is in the range between 0.05% and 50%. In one embodiment, graphene layer 205 may include 1 to 30 layers of monoatomic graphene layers, e.g., 5 layers, 10 layers, 25 layers, etc. In addition, graphene layer 205 may include a layer of fluorinated graphene, which is thermally stable and chemically more stable to allow a better insulation of the metal interconnect line from the dielectric layer.

Figure 2D:
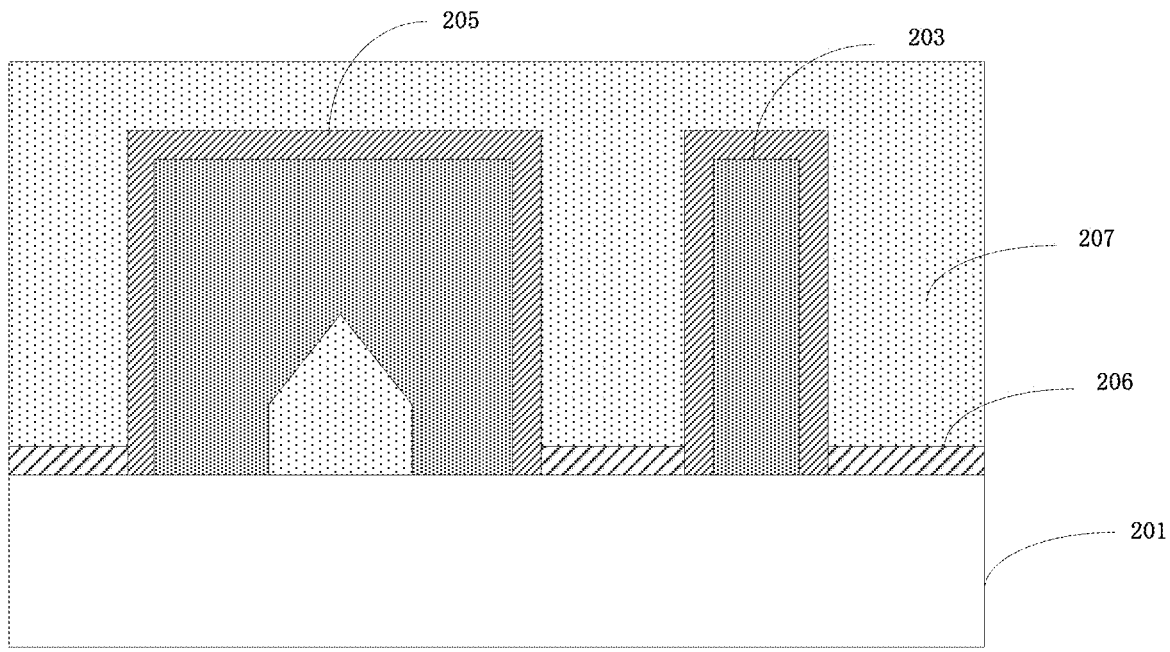
FIG. 2D is a cross-sectional view illustrating an intermediate stage of an interconnect structure according to one embodiment of the present disclosure.

Next, referring to FIG. 2D, a second dielectric layer 207 is formed filling recess 204 and covering graphene layer 205. Second dielectric layer 207 may be of the same material or a different material than first dielectric layer 201. For example, second dielectric layer 207 and first dielectric layer 202 may include a low-k or ultra low-k dielectric material, or one of second dielectric layer 207 and first dielectric layer 202 may include silicon oxide, and the other one may include a low-k dielectric material.

Figure 2E:
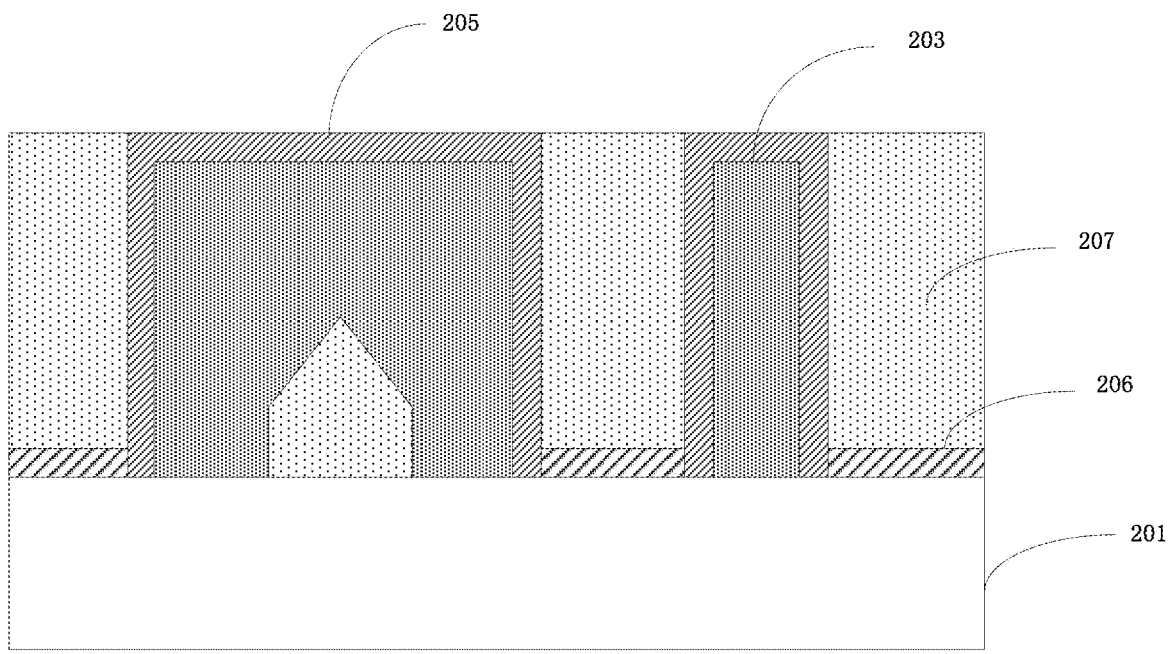
FIG. 2E is a cross-sectional view illustrating an intermediate stage of an interconnect structure according to one embodiment of the present disclosure.
Figure 2F:
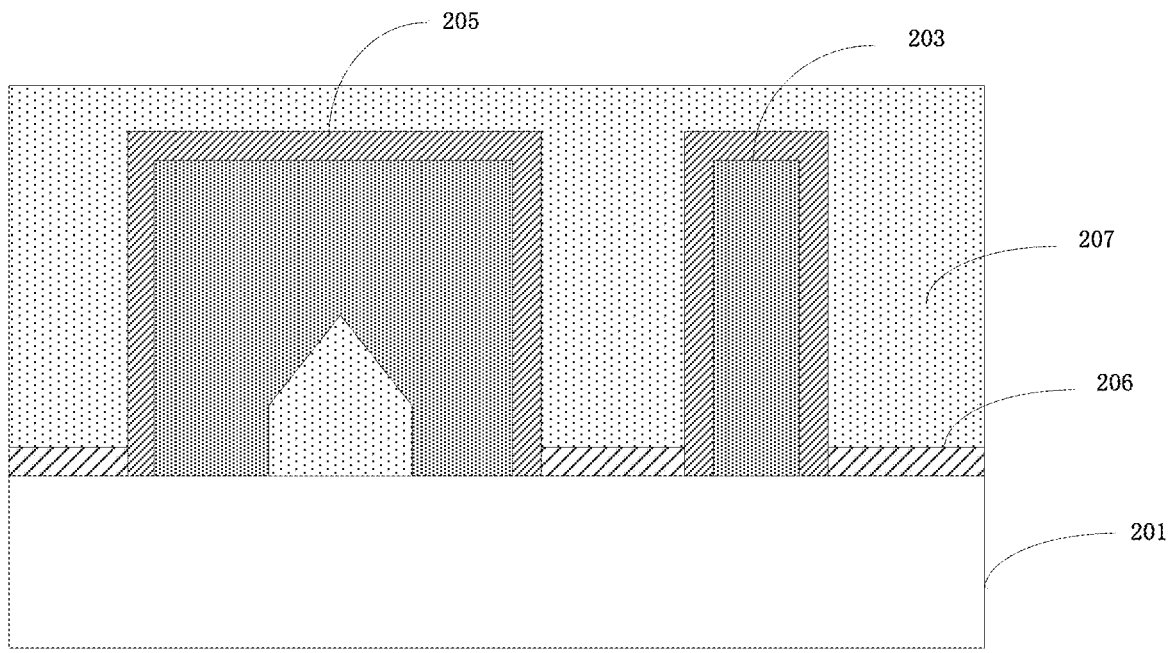
FIG. 2F is a cross-sectional view illustrating an intermediate stage of an interconnect structure according to one embodiment of the present disclosure.

Next, referring to FIG. 2E and FIG. 2F, a planarization (e.g., chemical mechanical polishing) process is performed on second dielectric layer 207. In one embodiment, as shown in FIG. 2E, after the planarization, the planarized second dielectric layer 207 has an upper surface that is substantially flush with the surface portion of graphene layer 205 on metal interconnect line 203. In another embodiment, as shown in FIG. 2F, after the planarization, the planarized second dielectric layer 207 may still cover graphene layer 205. As used herein, the term "substantially flush" means flushness between two surfaces within some tolerance under normal process variation.

An interconnect structure can thus be obtained according to the manufacturing method shown and described according to FIGS. 2A to 2F.

An interconnect structure according to an embodiment of the present disclosure will be described with reference to FIG. 2E.

Referring to FIG. 2E, the interconnect structure may include a substrate 201; a metal interconnect line 203 on substrate 201; a graphene layer 205 on the upper surface and sidewalls (side surface) of metal interconnect line 203; and a dielectric layer (corresponding to second dielectric layer 207) on a portion of graphene layer 205 on the sidewalls of metal interconnect line 203. Second dielectric layer 207 does not cover the upper surface of metal interconnect line 203. In one embodiment, the upper surface of second dielectric layer 207 is substantially flush with the surface portion of graphene layer 205 on the upper surface of metal interconnect line 203.

An interconnect structure according to another embodiment of the present disclosure will be described with reference to FIG. 2F.

Referring to FIG. 2F, the interconnect structure may include a substrate 201; a metal interconnect line 203 on substrate 201; a graphene layer 205 on the upper surface and sidewalls of metal interconnect line 203; and a dielectric layer (corresponding to second dielectric layer 207) on graphene layer 205 on the upper surface and sidewalls of metal interconnect line 203.

FIGS. 3A to 3H are simplified cross-sectional views of intermediated stages of an interconnect structure according to another embodiment of the present disclosure. It is noted that the manufacturing method of an interconnect structure has been described in detail above with reference to FIGS. 2A to 2F, only the differences from the above-described method associated with FIGS. 2A to 2F will the described in detail below.

Figure 3A:
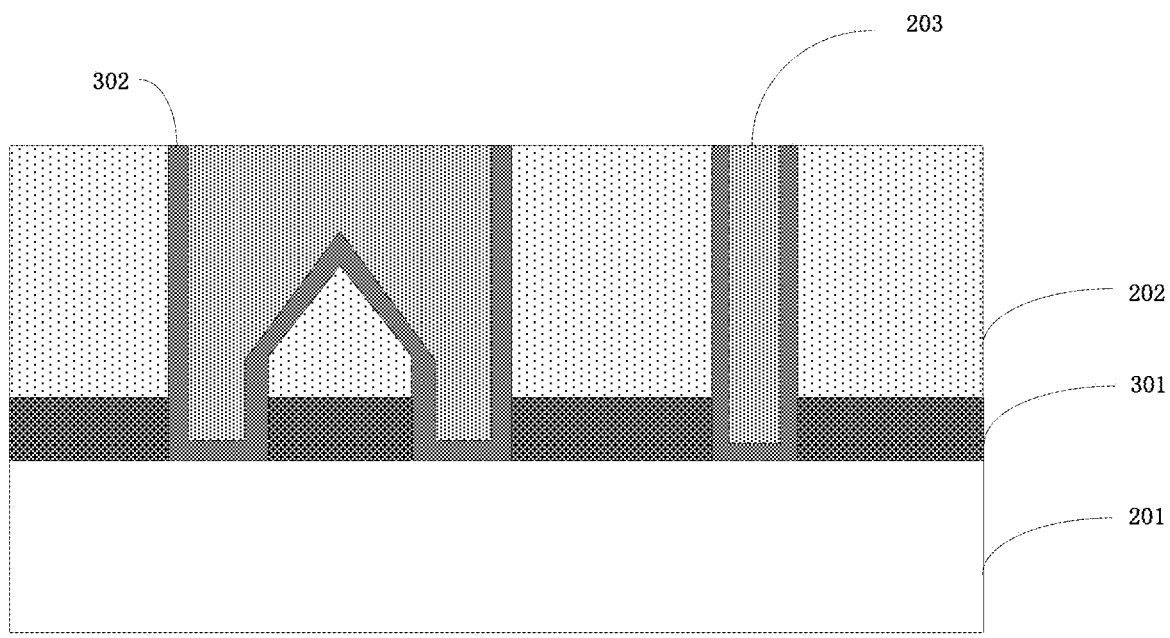
FIG. 3A is a cross-sectional view illustrating an intermediate stage of an interconnect structure according to another embodiment of the present disclosure.

Referring to FIG. 3A, a substrate structure is provided, which includes a substrate 201, a first barrier layer 301 on substrate 201, a first dielectric layer 202 on first barrier layer 301, and a metal interconnect line 203 extending through first dielectric layer 202 and first barrier layer 301. Comparing with the substrate structure in FIG. 2A, the substrate structure further includes first barrier layer 301 disposed between substrate 201 and first dielectric layer 202. First barrier layer 301 may include, but not limited to, SiCN. In addition, the substrate structure may further include a second barrier layer 302 disposed around metal interconnect line 203, i.e., metal interconnect line 203 is disposed on second barrier layer 302. In one embodiment, second barrier layer 302 may include Ta, TaN or stacked layers of Ta and TaN. However, embodiments of the present disclosure are not limited thereto.

Figure 3B:
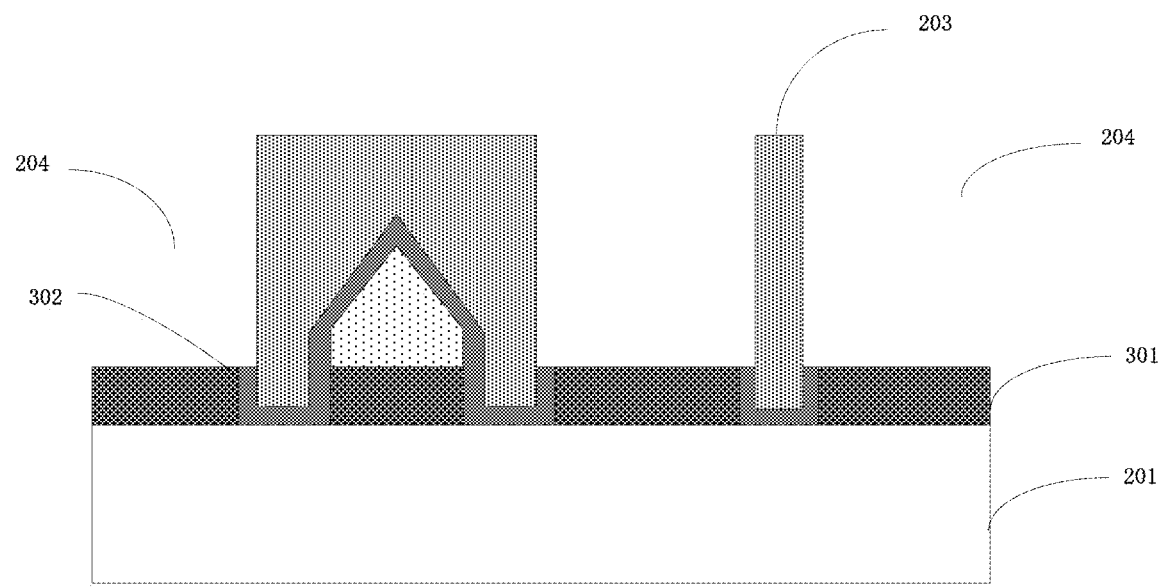
FIG. 3B is a cross-sectional view illustrating an intermediate stage of an interconnect structure according to another embodiment of the present disclosure.

Next, referring to FIG. 3B, a portion of first dielectric layer 202 on opposite sides of metal interconnect line 203 is removed to form a recess 204, such that the side surface of metal interconnect line 203 is exposed. In one embodiment, a portion of first dielectric layer 202 on opposite sides of metal interconnect line 203 may be removed to expose a portion of second barrier layer 302 on the opposite sides of metal interconnect line 203, the exposed portion of second barrier layer 302 is then removed to form recess 204.

Figure 3C:
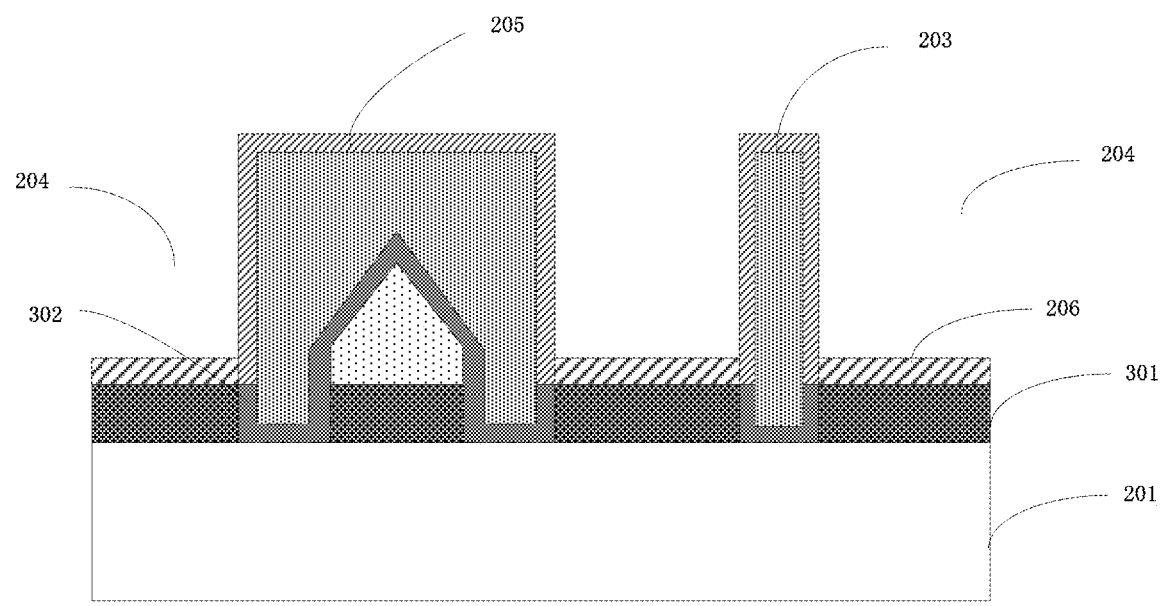
FIG. 3C is a cross-sectional view illustrating an intermediate stage of an interconnect structure according to another embodiment of the present disclosure.

Next, referring to FIG. 3C, a graphene layer 205 is formed on the exposed surface of metal interconnect line 203. In one embodiment, while graphene layer 205 is formed on the exposed surface of metal interconnect line 203, an amorphous carbon layer 206 may also be formed on the exposed first barrier layer 301, which may serve as an insulating layer between a subsequently formed dielectric layer and the substrate. The steps of forming graphene layer 205 can be referred to the above described sections, and will not be repeated herein.

Figure 3D:
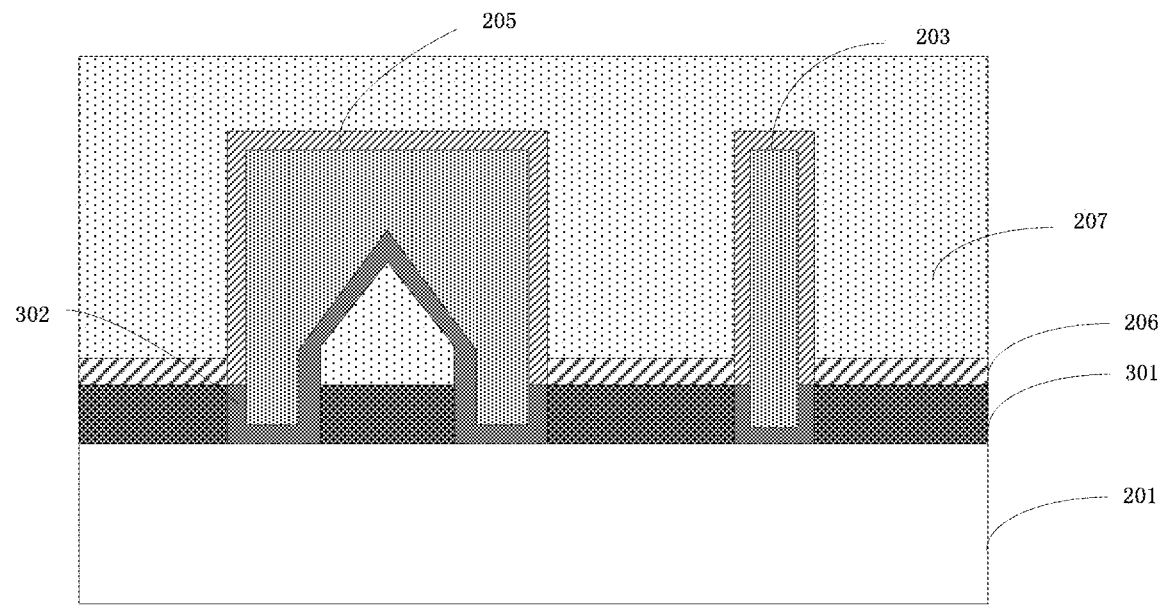
FIG. 3D is a cross-sectional view illustrating an intermediate stage of an interconnect structure according to another embodiment of the present disclosure.

Next, referring to FIG. 3D, a second dielectric layer 207 is formed filling recess 204 and covering graphene layer 205.

Figure 3E:
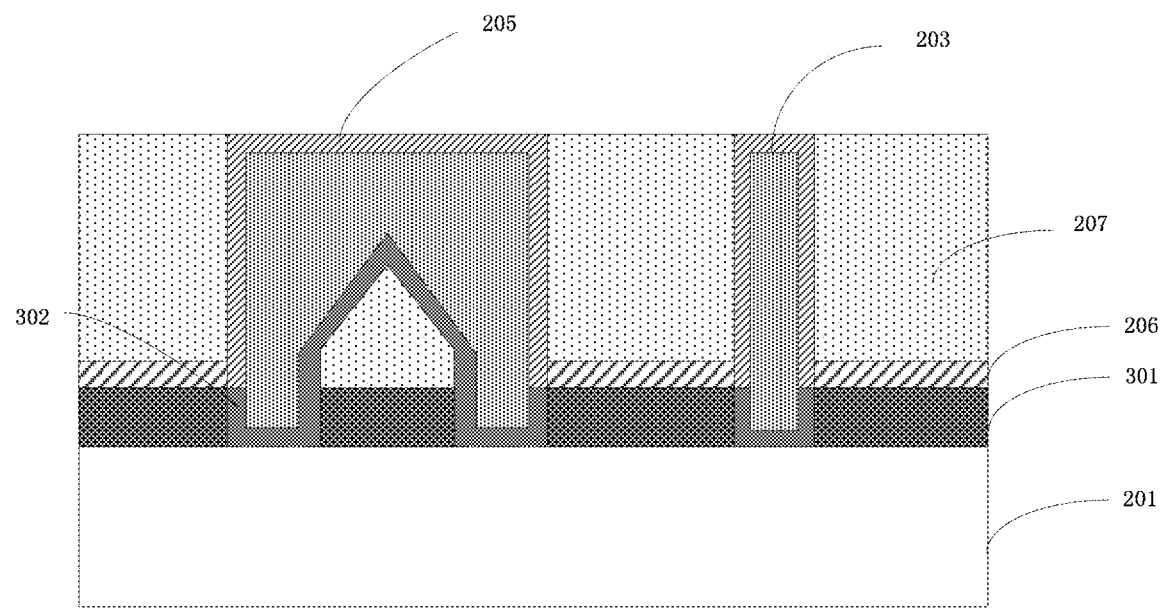
FIG. 3E is a cross-sectional view illustrating an intermediate stage of an interconnect structure according to another embodiment of the present disclosure.
Figure 3F:
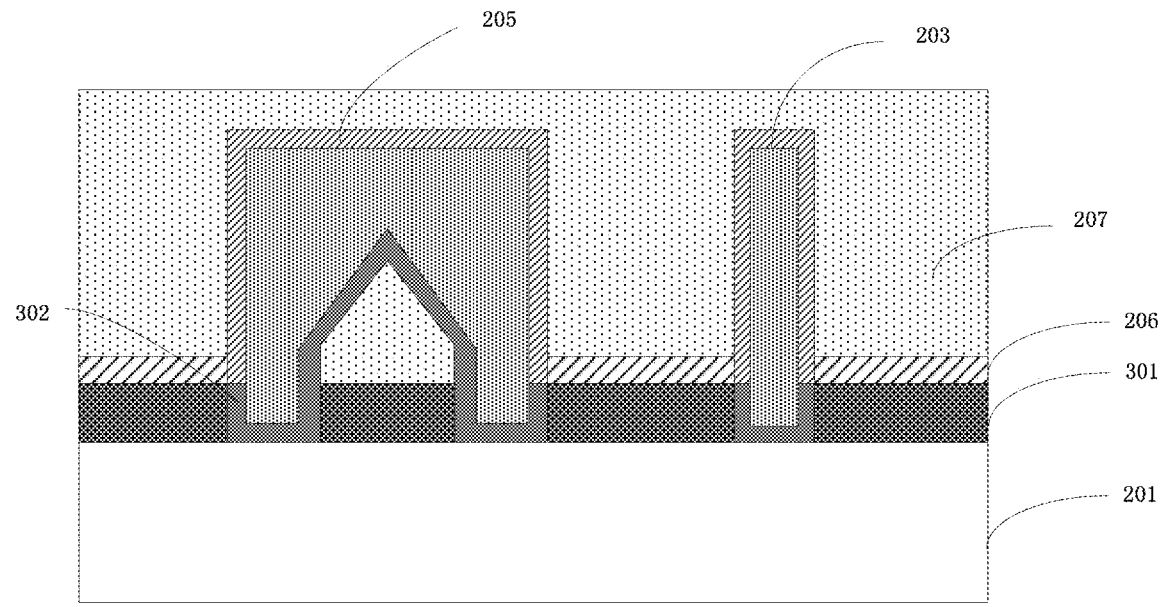
FIG. 3F is a cross-sectional view illustrating an intermediate stage of an interconnect structure according to another embodiment of the present disclosure.

Next, referring to FIG. 3E and FIG. 3F, a planarization (e.g., chemical mechanical polishing) process is performed on second dielectric layer 207. In one embodiment, as shown in FIG. 3E, after the planarization, the planarized second dielectric layer 207 has an upper surface that is substantially flush with the surface portion of graphene layer 205 on metal interconnect line 203. In another embodiment, as shown in FIG. 3F, after the planarization, the planarized second dielectric layer 207 may still cover graphene layer 205.

An interconnect structure can thus be obtained according to the manufacturing method shown and described in FIGS. 3A to 3F.

An interconnect structure according to an embodiment of the present disclosure will be described with reference to FIG. 3E.

Referring to FIG. 3E, the interconnect structure may include a substrate 201; a metal interconnect line 203 on substrate 201; a graphene layer 205 on the upper surface and sidewalls (side surface) of metal interconnect line 203; a dielectric layer (corresponding to second dielectric layer 207) on a portion of graphene layer 205 on the sidewalls of metal interconnect line 203; and a barrier layer (corresponding to first barrier layer 301) disposed between the dielectric layer and substrate 201. Graphene layer 205 is formed on the upper surface of metal interconnect line 203 and on side surface of metal interconnect line 203 above first barrier layer 301; and the dielectric layer (corresponding to second dielectric layer 207) does not cover the portion of graphene layer 205 on the upper surface of metal interconnect line 203. Further, the interconnect structure may further include an amorphous carbon layer 206 between first barrier layer 301 and the dielectric layer (corresponding to second dielectric layer 207).

An interconnect structure according to another embodiment of the present disclosure will be described with reference to FIG. 3F. Comparing with the interconnect structure in FIG. 3E, the dielectric layer (corresponding to second dielectric layer 207) of the interconnect structure in FIG. 3F not only covers a portion of graphene layer 205 on the sidewalls of metal interconnect line 203, but also a portion of graphene layer 205 on the upper surface of metal interconnect line 203.

Further, the interconnect structures in FIGS. 3E and 3F may also include second barrier layer 302 disposed between metal interconnect layer 203 and substrate 201 and between metal interconnect layer 203 and first barrier layer 301.

Figure 3G:
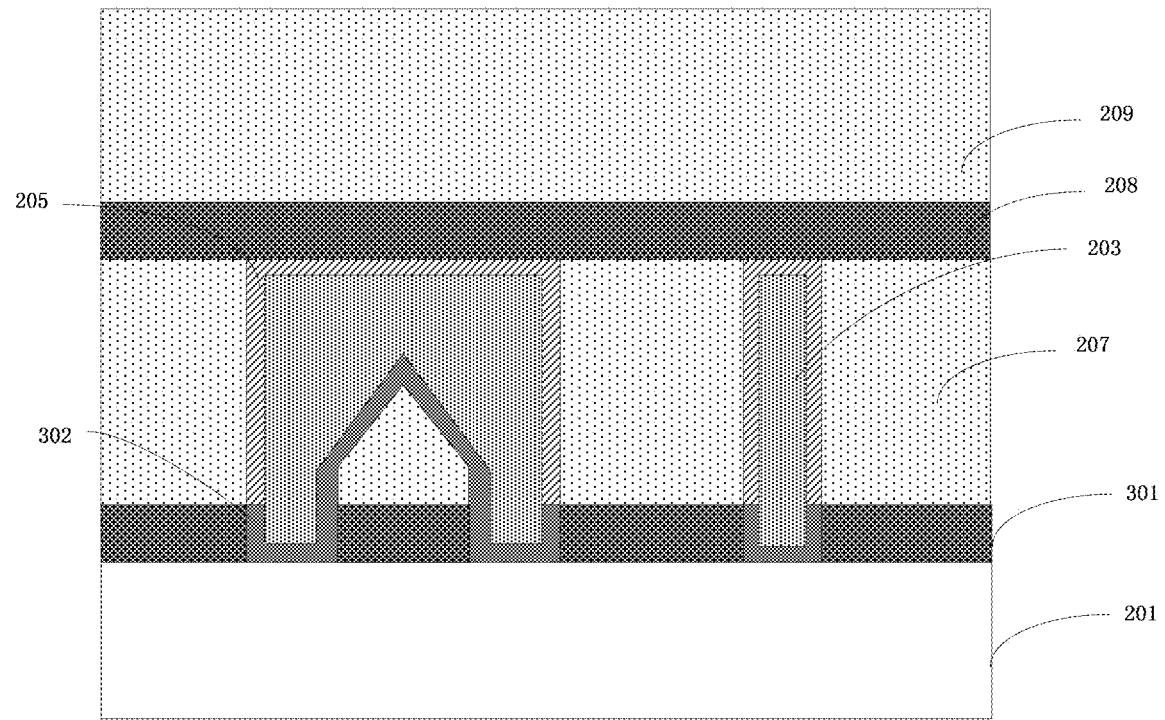
FIG. 3G is a cross-sectional view illustrating an intermediate stage of an interconnect structure according to another embodiment of the present disclosure.
Figure 3H:
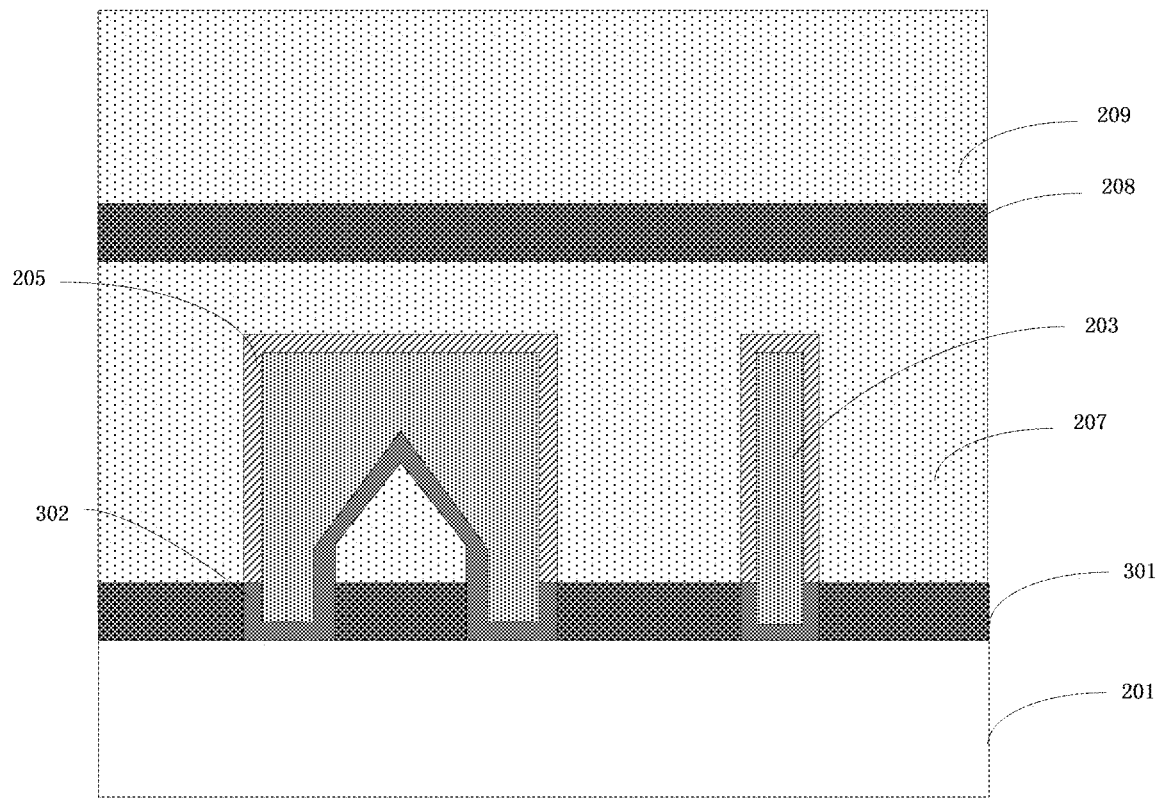
FIG. 3H is a cross-sectional view illustrating an intermediate stage of an interconnect structure according to another embodiment of the present disclosure.

Thereafter, a third barrier layer 208 may be formed on the interconnect structures in FIGS. 3E and 3F to form another interconnect structures. A third dielectric layer 209 is formed on third barrier layer 208 of the interconnect structures, as shown in FIGS. 3G and 3H. In one embodiment, third dielectric layer 209 may be formed directly on the interconnect structures in FIGS. 3E and 3F.

Comparing with the interconnect structure in FIG. 3E, the interconnect structure in FIG. 3G may further include a third barrier layer 208 on a portion of graphene layer 205 on the upper surface of metal interconnect line 203 and the dielectric layer (corresponding to second dielectric layer 207), and a third dielectric layer 209 on third barrier layer 208.

Comparing with the interconnect structure in FIG. 3F, the interconnect structure in FIG. 3H may further include a dielectric layer (corresponding to third dielectric layer 209) on the dielectric layer (corresponding to second dielectric layer 207). Preferably, the interconnect structure in FIG. 3H may further include a third barrier layer 208 between the second dielectric layer (207) and the third dielectric layer (209).

FIGS. 4A-4F are simplified cross-sectional views illustrating the intermediate stages of forming the interconnect structure shown in FIG. 3A.

Figure 4A:
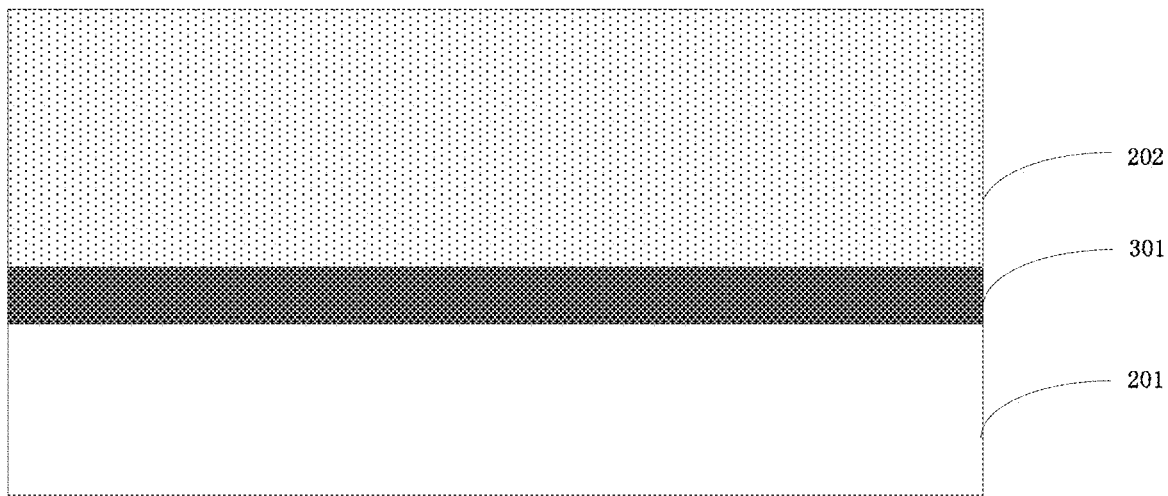
FIG. 4A is a cross-sectional view illustrating an intermediate stage of a substrate structure according to one embodiment of the present disclosure.

Referring to FIG. 4A, a substrate 201 is provided. A first barrier layer 301 is formed on substrate 201; and a first dielectric layer 202 is formed on first barrier layer 301.

Figure 4B:
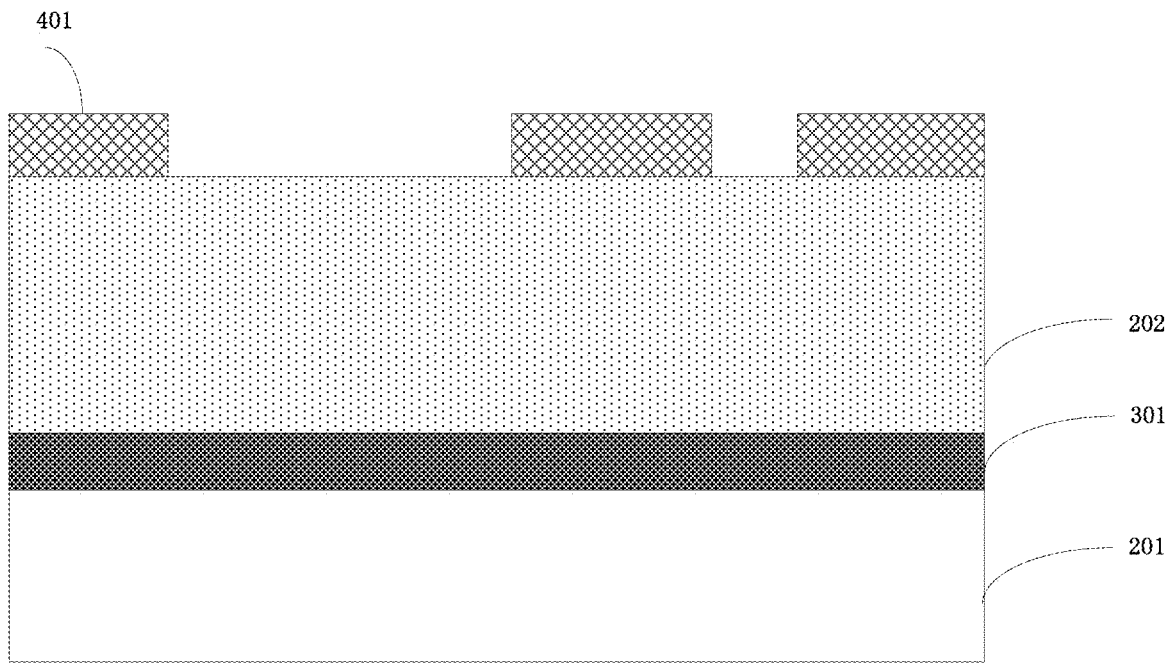
FIG. 4B is a cross-sectional view illustrating an intermediate stage of a substrate structure according to one embodiment of the present disclosure.

Next, referring to FIG. 4B, a patterned first hardmask 401 is formed on first dielectric layer 202. Hardmask 401 may include, for example, one or more of the following materials: titanium nitride (TiN), tetraethoxysilane (TEOS), and SiOCH.

Thereafter, first dielectric layer 202 and first barrier layer 301 are sequentially etched using patterned first hardmask 401 as a mask to form a through-hole extending to substrate 201.

In one embodiment, the through-hole is formed as a through-hole having a damascene structure. The formation of the through-hole will be described with reference to FIGS. 4C through 4E.

Figure 4C:
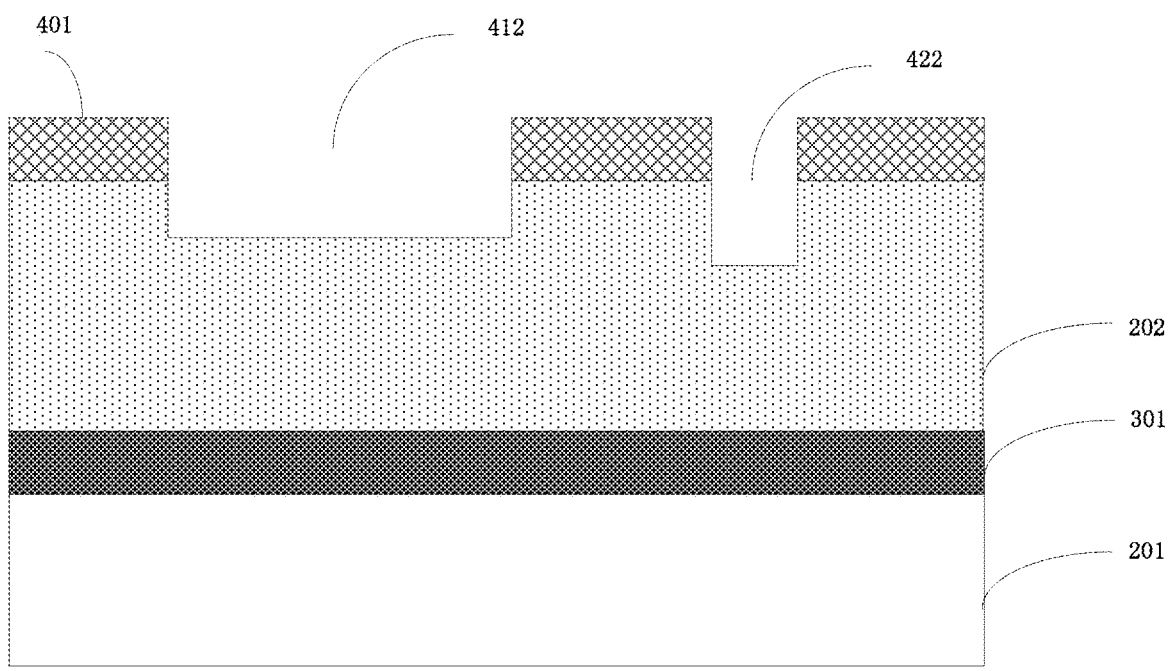
FIG. 4C is a cross-sectional view illustrating an intermediate stage of a substrate structure according to one embodiment of the present disclosure.

Referring to FIG. 4C, first dielectric layer 202 is etched using patterned first hardmask 401 as a mask to form a first opening 412 and second opening 422.

Figure 4D:
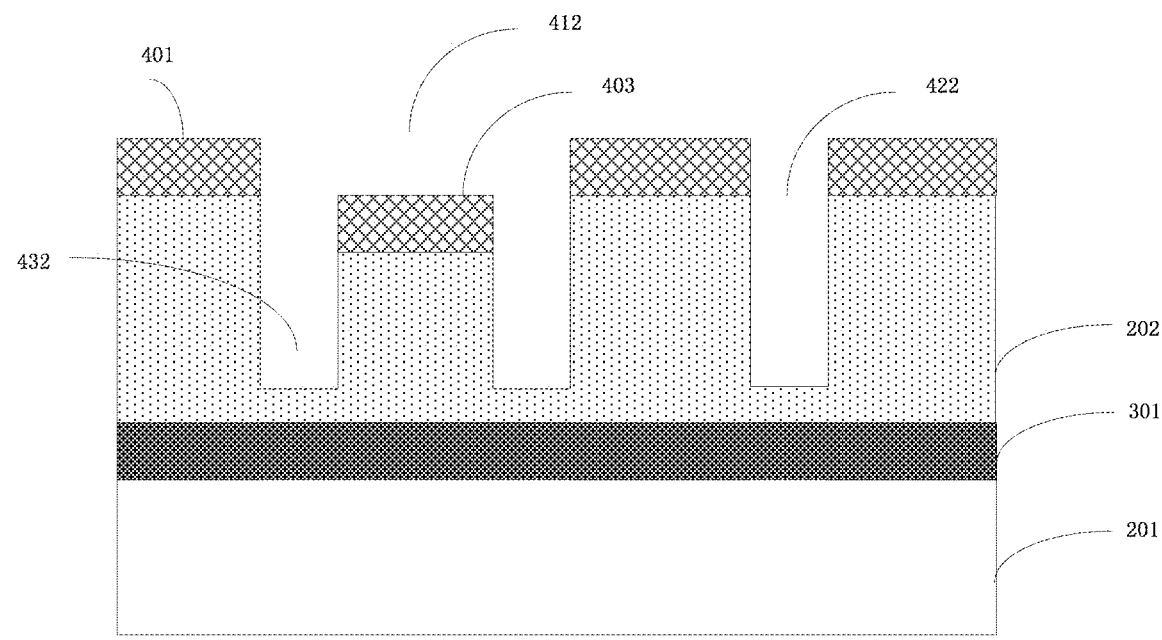
FIG. 4D is a cross-sectional view illustrating an intermediate stage of a substrate structure according to one embodiment of the present disclosure.

Referring to FIG. 4D, a patterned second hardmask 403 is formed on first opening 412, and first dielectric layer 202 is etched using patterned first hardmask 401 and patterned second hardmask 403 as a mask to form a third opening 432. At the same time, the bottom surface of second opening 422 also continues to extend downwardly.

Figure 4E:
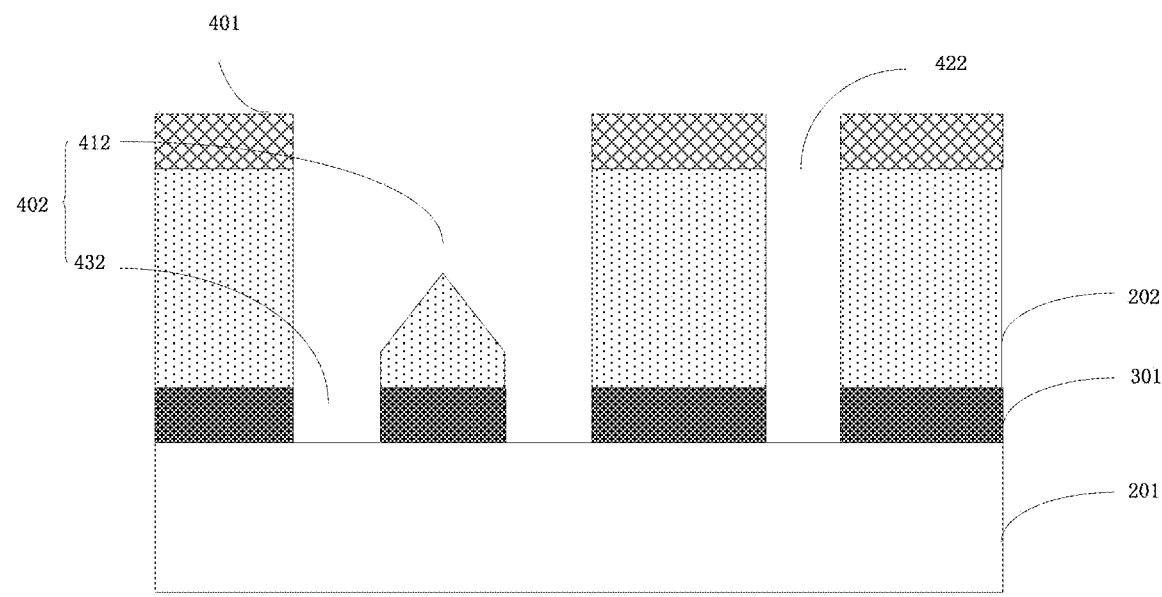
FIG. 4E is a cross-sectional view illustrating an intermediate stage of a substrate structure according to one embodiment of the present disclosure.

Referring to FIG. 4E, patterned second hardmask 403 is removed, and the remaining first dielectric layer 202 and first barrier layer 301 are etched using patterned first hardmask 401 as a mask to form a first through-hole 402 and a second through-hole 422. First though-hole 402 includes a wider first opening 412 at the upper portion and a narrower third opening 432 at the lower portion. At the same time, the bottom of second opening 422 extends to substrate 201 to form second through-hole 422. It should be noted that, after the remaining first dielectric layer 202 and first barrier layer 301 are etched with patterned first hardmask 401, a portion of first dielectric layer 202 between two third openings 432 includes two slopes as shown in FIG. 4E, but it is merely illustrative and should not be construed as limiting the present disclosure.

Figure 4F:
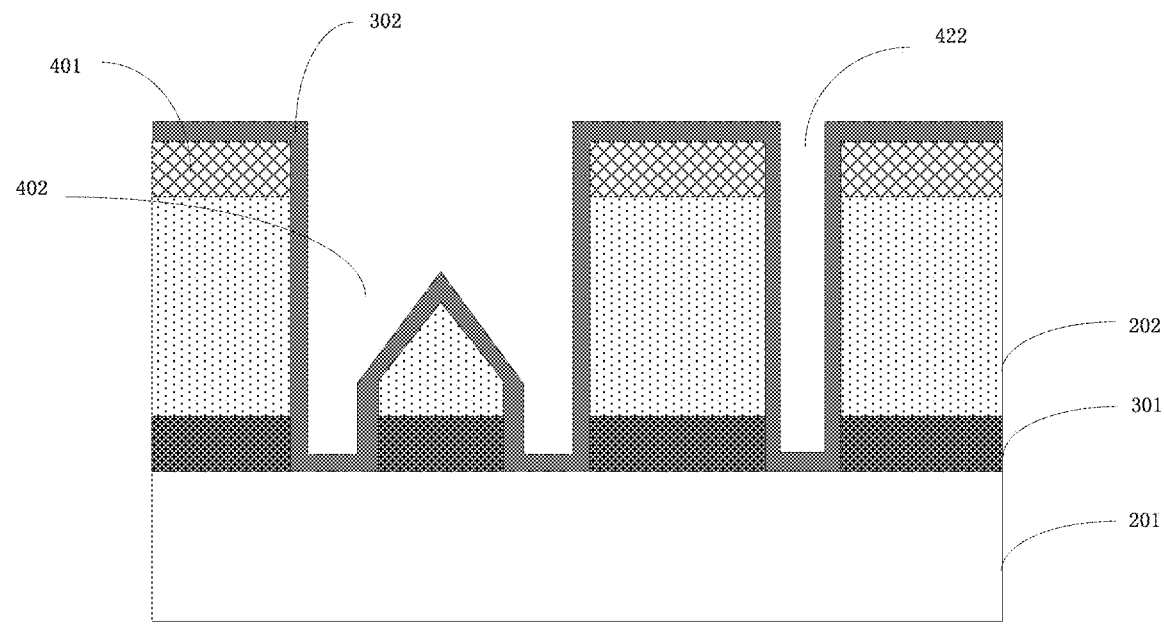
FIG. 4F is a cross-sectional view illustrating an intermediate stage of a substrate structure according to one embodiment of the present disclosure.

Next, referring to FIG. 4F, after forming the through-holes (402, 422), a second barrier layer 302 is formed on sidewalls of the through-holes (including first through-hole 402 and second through-hole 422). Herein, second barrier layer 302 is also formed on first hardmask 401.

Figure 4G:
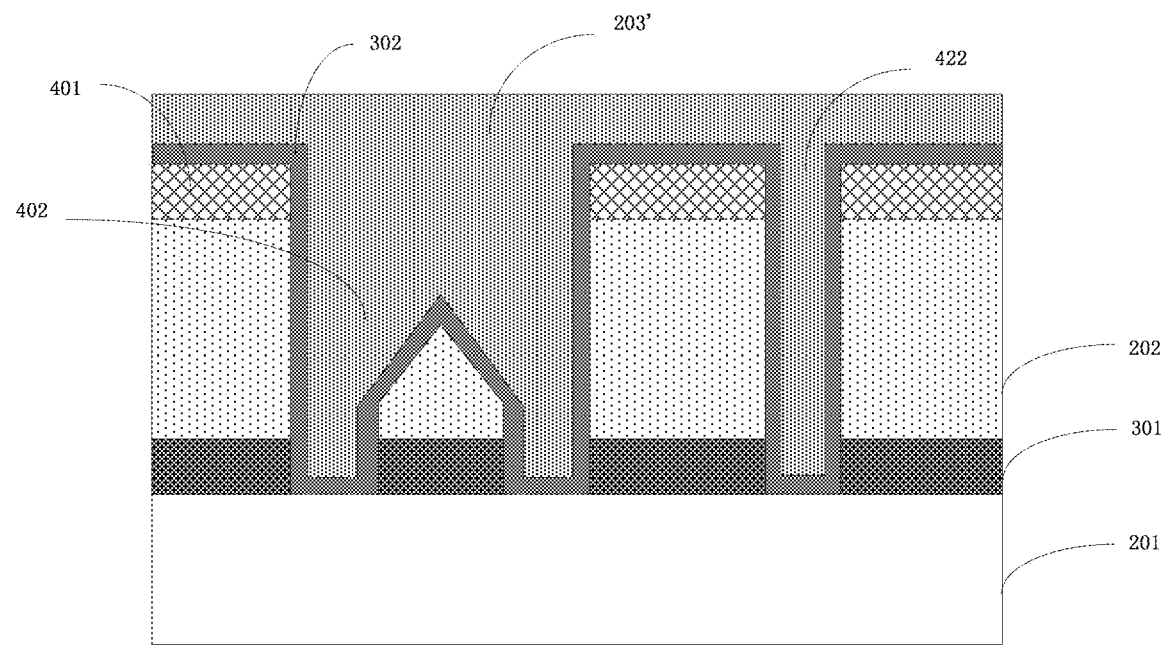
FIG. 4G is a cross-sectional view illustrating an intermediate stage of a substrate structure according to one embodiment of the present disclosure.

Next, referring to FIG. 4G, a metal layer 203' is formed in the through-holes (including first through-hole 402 and second through-hole 422). In an exemplary embodiment, copper may be deposited as metal layer 203' using an electrochemical deposition (ECP) process. Preferably, a copper seed layer may also be formed on the surface of the through-holes prior to depositing copper by the ECP process.

Thereafter, a planarization process is performed to remove patterned first hardmask 401 and expose a surface of the remaining first dielectric layer 202, thereby forming the substrate structure shown in FIG. 3A. For example, a portion of the metal layer on first dielectric layer 202, a portion of second barrier layer 302, and first hardmask layer 401 may be removed through a planarization process. For example, metal layer 203' may be planarized using a planarization (e.g., chemical mechanical polishing) process to expose a portion of second barrier layer 302 on first hardmask 401, followed by an additional process to remove the portion of second barrier layer 302 on first hardmask 401 and first hardmask 401 to expose a surface of first dielectric layer 202. A specific implementation of the substrate structure shown in FIG. 3A is thus described. However, the present disclosure is not limited thereto, and the substrate structure may be formed by other conventional means. After forming the substrate structure shown in FIG. 3A, the subsequent steps may be continues according to the process flow shown and described with reference to FIGS. 3A through 3H.

In summary, embodiments of the present disclosure provide detailed description of a semiconductor device and method of manufacturing the same. In order not to obscure the concept of the present disclosure, some of the details known in the art are not described.

As used herein, the term "substrate" may include, but is not limited to, a substrate of a semiconductor material (e.g., a silicon substrate). In an example embodiment, the term "substrate" may also include a semiconductor device formed on a substrate of a semiconductor material. In another example embodiment, the term "substrate" may also include a metal contact formed on a substrate of a semiconductor material.

As used herein, the term "flush" may include, but is not limited to, a substantially flat surface instead of absolute flat, that allows for some errors within the process tolerance and coplanar with another flat surface. In other words, the term "flush" is defined to include surfaces that are substantially disposed on the same plane, but may include minor differences with the process tolerance.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. An interconnect structure, comprising:
   a substrate;
   a metal interconnect line including an upper surface and a side surface on the substrate;
   a graphene layer conformally covering the upper surface and the side surface of the metal interconnect line;
   a first barrier layer in contact with a surface portion of the substrate;
   a first dielectric layer on the first barrier layer and in contact with a portion of the graphene layer on the side surface of the metal interconnect line, the dielectric layer being made of a material different from a material of the first barrier layer and having an upper surface flush with an upper surface of the graphene layer, wherein the first dielectric layer has a first portion directly under the metal interconnect line; and
   a second barrier layer having a first portion directly between the metal interconnect line and the first portion of the first dielectric layer and a second portion directly between the metal interconnect line and the first barrier layer, wherein the first portion of the first dielectric layer is completely surrounded by the first portion of the second barrier layer and the first barrier layer.

2. The interconnect structure of claim 1, wherein the dielectric layer does not cover a portion of the graphene layer on the upper surface of the metal interconnect line.

3. The interconnect structure of claim 1, further comprising:
   a second dielectric layer on the graphene layer for forming a second interconnect structure.

4. The interconnect structure of claim 2, further comprising:
   a third barrier layer on the upper surface of the metal interconnect line and on the dielectric layer; and
   a third dielectric layer on the third barrier layer for forming a new interconnect structure.

5. The interconnect structure of claim 1, wherein the dielectric layer further covers a portion of the graphene layer on the upper surface of the metal interconnect line.

6. The interconnect structure of claim 5, further comprising:
   a second dielectric layer on the first dielectric layer for forming a second interconnect structure.

7. The interconnect structure of claim 6, further comprising:
   a third barrier layer between the first dielectric layer and the second dielectric layer.

8. The interconnect structure of claim 1, further comprising an amorphous carbon layer between the first barrier layer and the dielectric layer.

9. The interconnect structure of claim 1, wherein the first barrier layer comprises SiCN, and the second barrier layer comprises Ta, TaN, or stacked layers of Ta and TaN.

10. The interconnect structure of claim 1, wherein the graphene layer comprises a layer of fluorinated graphene.

11. The interconnect structure of claim 1, wherein the metal interconnect line comprises a damascene structure.

12. The interconnect structure of claim 1, wherein the metal interconnect line comprises copper, and the dielectric layer comprises silicon oxide or a low-k dielectric material.

13. The interconnect structure of claim 1, wherein the graphene layer comprises 1 to 30 layers of monoatomic graphene layers.

14. The interconnect structure of claim 1, wherein the metal interconnect line extends through the dielectric layer and the first barrier layer.

15. The interconnect structure of claim 1, wherein the metal interconnect line comprises a lower portion surrounding a structure comprising a portion of the first barrier layer and a portion of the dielectric layer on the portion of the first barrier layer.

16. The interconnect structure of claim 15, wherein the metal interconnect line further comprises an upper portion on the lower portion, the upper portion having a lateral surface greater than a lateral surface of the lower portion.

17. The interconnect structure of claim 16, wherein the first portion of the dielectric layer on the portion of the first barrier layer has a slanted surface toward the upper portion of the metal interconnect line.

* * * * *